US009218958B2

(12) United States Patent
Schulze et al.

(10) Patent No.: US 9,218,958 B2
(45) Date of Patent: Dec. 22, 2015

(54) METHOD FOR FORMING A SEMICONDUCTOR DEVICE

(71) Applicant: Infineon Technologies AG, Neubiberg (DE)

(72) Inventors: Hans-Joachim Schulze, Taufkirchen (DE); Markus Zundel, Egmating (DE); Anton Mauder, Kolbermoor (DE); Andreas Meiser, Sauerlach (DE); Franz Hirler, Isen (DE); Hans Weber, Bayerisch Gmain (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/102,107

(22) Filed: Dec. 10, 2013

(65) Prior Publication Data

US 2015/0162192 A1 Jun. 11, 2015

(51) Int. Cl.
*H01L 21/425* (2006.01)
*H01L 21/02* (2006.01)
*H01L 21/265* (2006.01)
*H01L 21/321* (2006.01)

(52) U.S. Cl.
CPC .... *H01L 21/02258* (2013.01); *H01L 21/02164* (2013.01); *H01L 21/02238* (2013.01); *H01L 21/26513* (2013.01); *H01L 21/32105* (2013.01)

(58) Field of Classification Search
USPC .................. 438/514, 515, 516, 165, 770, 773
See application file for complete search history.

(56) References Cited

U.S. PATENT DOCUMENTS

| 4,131,488 A | 12/1978 | Lesk et al. |
| 5,164,325 A | 11/1992 | Cogan et al. |
| 6,084,284 A | 7/2000 | Adamic, Jr. |
| 6,222,217 B1 | 4/2001 | Kunikiyo |
| 6,690,062 B2 | 2/2004 | Henninger et al. |
| 6,734,084 B1 | 5/2004 | Nemoto et al. |
| 6,891,223 B2 | 5/2005 | Krumrey et al. |
| 2006/0042957 A1* | 3/2006 | He .................................. 205/687 |
| 2006/0060238 A1 | 3/2006 | Hacke et al. |

(Continued)

FOREIGN PATENT DOCUMENTS

| DE | 10212144 A1 | 10/2003 |
| DE | 10212149 A1 | 10/2003 |
| DE | 10234996 A1 | 10/2003 |

OTHER PUBLICATIONS

P. Benkart, et al.; "3-Dimensional Integration Scheme with a Thermal Budget Below 300 Degrees C"; In: Book of Abstracts APCOT 2006, Asia-Pacific Conference of Transducers and Micro-Nano Technology, Marina Mandarin Hotel, Singapore, Jun. 25-28, 2006, p. 1-4.

(Continued)

*Primary Examiner* — Timor Karimy
(74) *Attorney, Agent, or Firm* — Eschweiler & Associates, LLC (57) ABSTRACT

A method for forming a semiconductor device includes carrying out an anodic oxidation of a surface region of a semiconductor substrate to form an oxide layer at a surface of the semiconductor substrate by generating an attracting electrical field between the semiconductor substrate and an external electrode within an electrolyte to attract oxidizing ions of the electrolyte, causing an oxidation of the surface region of the semiconductor substrate. Further, the method includes reducing the number of remaining oxidizing ions within the oxide layer, while the semiconductor substrate is within an electrolyte.

5 Claims, 4 Drawing Sheets

(56) References Cited

U.S. PATENT DOCUMENTS

2006/0141751 A1* 6/2006 Liao et al. .................... 438/466
2010/0258177 A1 10/2010 Ko et al.

OTHER PUBLICATIONS

Beynon, J, et al.: The Electrical Properties of Anodically Grown Silicon Dioxide Films. In: Solid-State 16 (1973), S. 309-314.

Mende, G, et al. The Electrophysical Properties of Anodically Grown Silicon Oxide Films. In: Thin Solid Films 168 (1989), S. 51-60.
Kaiser, Alexander. "Three-Dimensional System Integration: Technological Development and Use." Published by Cuvillier Verlag (2007), p. 55-57.
U.S. Appl. No. 14/102,290, filed Dec. 10, 2013. 46 Pages.
Non Final Office Action Dated Mar. 20, 2015 U.S. Appl. No. 14/102,290.
Final Office Action dated Jul. 9, 2015 for U.S. Appl. No. 14/102,290.

\* cited by examiner

METHOD FOR FORMING A SEMICONDUCTOR DEVICE

FIELD

Embodiments relate to the manufacturing of semiconductor device and in particular to methods for forming a semiconductor device.

BACKGROUND

For the manufacturing of semiconductor devices, a large variety of materials and processes are used. Often, electrically conductive parts of the semiconductor device have to be electrically insulated from other electrically conductive parts of the semiconductor device. The maximal allowable voltages and the reachable lifetime of the semiconductor device are strongly influenced by the quality and the dimensioning of the electrically insulating parts of the semiconductor device. It is desired to increase the lifetime and/or the maximal allowable voltages of the semiconductor device.

SUMMARY

Some embodiments relate to a method for forming a semiconductor device. The method comprises carrying out an anodic oxidation of a surface region of a semiconductor substrate to form an oxide layer at a surface of the semiconductor substrate by generating an attracting electrical field between the semiconductor substrate and an external electrode within an electrolyte to attract oxidizing ions of the electrolyte causing an oxidation of the surface region of the semiconductor substrate. Further, the method comprises reducing the number of remaining oxidizing ions within the oxide layer, while the semiconductor substrate is within an electrolyte.

Further embodiments relate to a method for forming a semiconductor device. The method comprising carrying out an anodic oxidation of a surface region of a semiconductor substrate to form an oxide layer at the surface of the semiconductor substrate by generating an attracting electrical field between the semiconductor substrate and an external electrode within an electrolyte to attract oxidizing ions of the electrolyte causing an oxidation of the surface region of the semiconductor substrate. Further, the method comprises stimulating the anodic oxidation independent from the attracting electrical field.

Some embodiments relate to a method for forming a semiconductor device. The method comprises forming at least one pn-junction within a semiconductor substrate. Further, the method comprises carrying out an anodic oxidation of the surface region of the semiconductor substrate to form an oxide layer at the surface of the semiconductor substrate by generating an attracting electrical field between the semiconductor substrate and an external electrode within an electrolyte to attract oxidizing ions of the electrolyte causing an oxidation of the surface region of the semiconductor substrate, while a high voltage difference occurs at the pn-junction due to the attracting electrical field. Additionally, the method comprises implanting dopants within the p-region or the n-region of the pn-junction reducing a blocking voltage of the pn-junction below the high voltage difference occurring at the pn-junction during the anodic oxidation.

BRIEF DESCRIPTION OF THE DRAWINGS

Some embodiments of apparatuses and/or methods will be described in the following by way of example only, and with reference to the accompanying figures, in which.

DETAILED DESCRIPTION

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Figure 4:
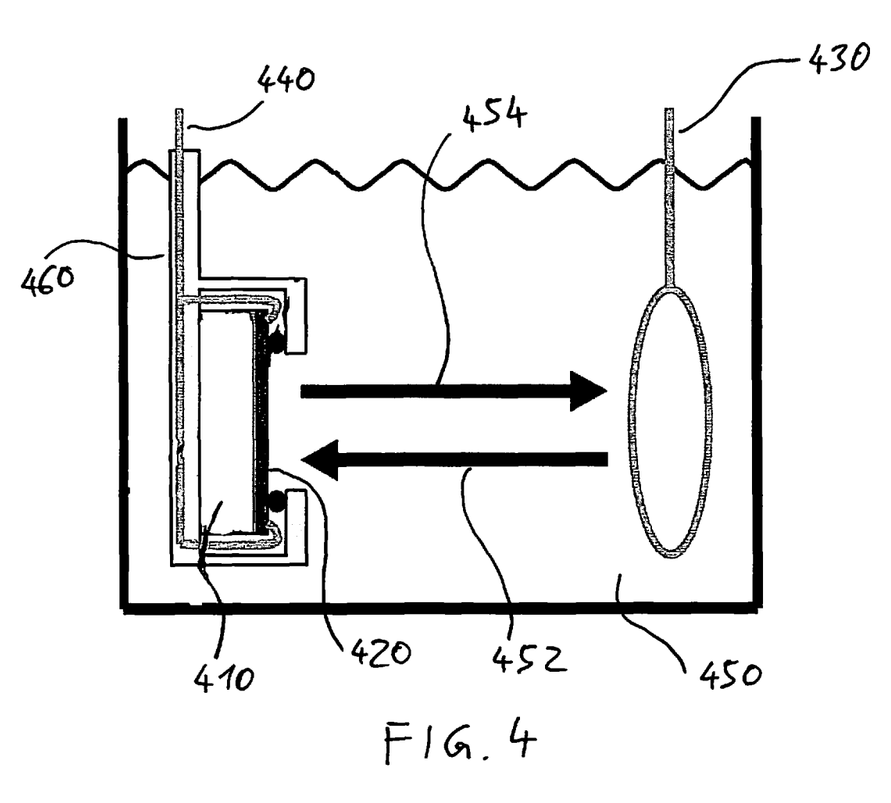
FIG. 4 shows a schematic illustration of an anodic oxidation.

Embodiments relate to the usage of anodic oxidation for forming insulating parts or layers of semiconductor devices. FIG. 4 shows a schematic illustration of a setup for anodic oxidation. A semiconductor substrate 410 is fixed on a holder 460 and placed within an electrolyte 450. Further, an external electrode 430 is placed within the electrolyte 450. By applying a voltage difference between the external electrode 430 (e.g. cathode) and an electrode 440 (e.g. anode) electrically connected to the semiconductor substrate 410, an electric field attracting oxidizing ions 452 to the semiconductor substrate can be generated. Ions of the opposite charge 454 are attracted by the external electrode 430. Due to the oxidizing ions, an oxide layer 420 is formed at a surface of the semiconductor substrate.

The kind or mixture of the electrolyte and/or the material of the external electrode may be selected depending on the kind of semiconductor substrate (e.g. Silicon, gallium aconite, Silicon Carbide), for example. In an example, the semiconductor substrate is a Silicon-based semiconductor substrate and an alkaline dissolution may be used.

The alkaline dissolution (e.g. Potassium hydroxide KOH, Tetramethylammonium hydroxide TMAH, Potassium nitrate $KNO_3$) may dissociate in positive and negative charged molecule parts. For example, the following reaction equation may apply for $KNO_3$:

$$KNO_3 + H_2O \rightarrow K^+ + OH^- + HNO_3$$

$OH^-$ ions getting in contact with Silicon can be used for forming an oxide layer. For this, a sufficient supply of $OH^-$ to the Silicon through the already established oxide layer by diffusion may be desired to be kept high. This diffusion may be accelerated by an electrical field (attracting electrical field) during the anodic oxidation so that significantly larger oxide thicknesses may be reached than with a native oxide.

For example, for a Silicon semiconductor substrate, the oxidizing ions may be OH-ions and the electrode connected to the semiconductor substrate may be used as an anode and the external electrode may be used as a cathode (e.g. platinum cathode).

In this way, an oxidation of n-doped and/or p-doped Silicon may be enabled.

Figure 1:
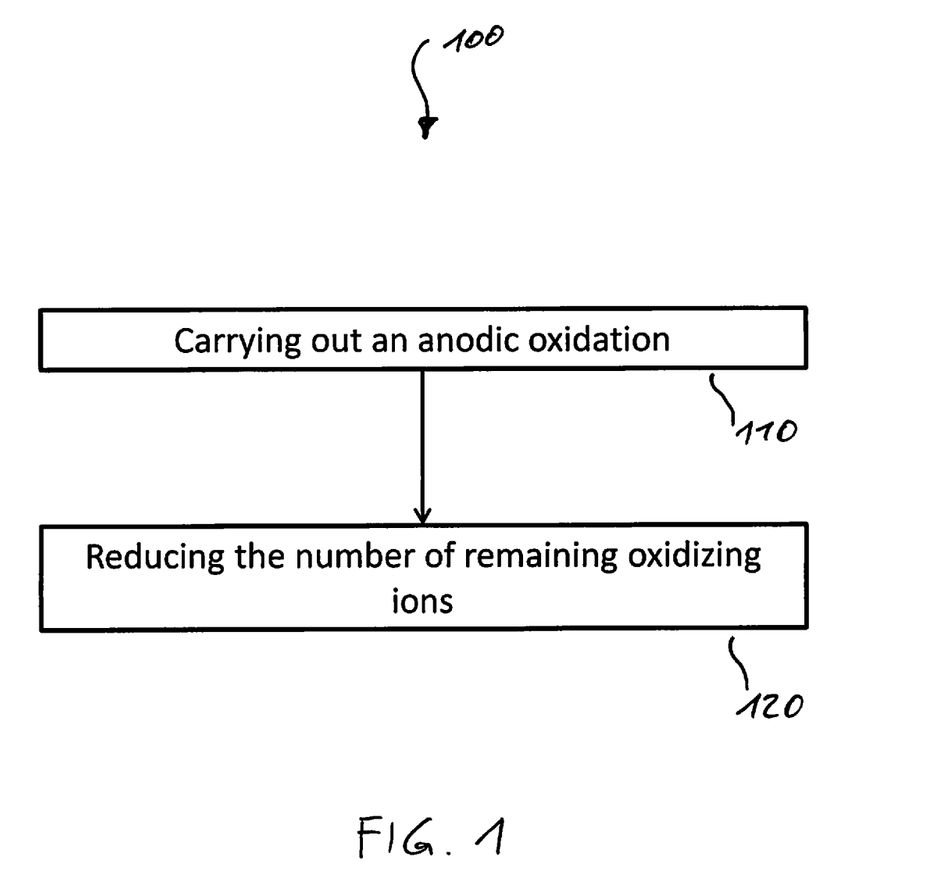
FIG. 1 shows a flow chart of a method for forming a semiconductor device.

FIG. 1 shows a flow chart of a method 100 for forming a semiconductor device according to an embodiment. The method 100 comprises carrying out an anodic oxidation 110 of a surface region of the semiconductor substrate to form an oxide layer at a surface of the semiconductor substrate by generating an attracting electrical field between the semiconductor substrate and an external electrode within an electrolyte to attract oxidizing ions of the electrolyte to the semiconductor substrate causing an oxidation of the surface region of the semiconductor substrate. Further, the method 100 comprises reducing 120 the number of remaining oxidizing ions within the oxidized surface region, while the semiconductor substrate is within an electrolyte.

By reducing the number of remaining oxidizing ions within the formed oxide layer, the quality of the oxide layer can be significantly improved. For example, a breakdown voltage of the oxide layer and/or a lifetime of the oxide layer may be increased. Consequently, a maximal allowable voltage and/or a lifetime of the semiconductor device may be increased.

The semiconductor substrate of the semiconductor device may be a silicon-based semiconductor substrate, a silicon carbide-based semiconductor substrate, a gallium arsenide-based semiconductor substrate or a gallium nitride-based semiconductor substrate, for example.

Depending on the material of the semiconductor substrate, the oxide layer may be a silicon oxide ($SiO_2$), a silicon carbide oxide layer, a gallium alkaline oxide layer or a gallium nitride oxide layer, for example.

The anodic oxidation may be carried out similar to the example shown in FIG. 4.

The surface region of the semiconductor substrate may be a region located at a surface (e.g. main surface used for implementing a main functionality of the semiconductor device) of the semiconductor substrate. The oxidation of the semiconductor material of the semiconductor substrate may start from the surface of the semiconductor substrate and may continue vertically into the semiconductor substrate. Afterwards, the surface region of the semiconductor substrate may form the oxide layer and the resulting new surface of the semiconductor substrate may form the interface between the remaining semiconductor material of the semiconductor substrate and the oxide layer, for example.

The semiconductor substrate may be oriented within the electrolyte so that the surface of the semiconductor substrate to be oxidized faces the external electrode, for example. The external electrode may comprise an arbitrary shape and/or size.

Depending on the voltage difference applied to the external electrode and the semiconductor substrate, an attracting electrical field of suitable strength can be obtained. An increase of the attracting electrical field may further accelerate the growth of the oxide layer and/or may increase the achievable thickness of the oxide layer, for example.

The electrolyte may be a suitable liquid providing ions oxidizing the material of the semiconductor substrate.

After the anodic oxidation, a large number of oxidizing ions, which did not contribute to the forming of the oxide layer may remain within the oxide layer. These remaining oxidizing ions may reduce the quality of the oxide layer (e.g. reduce a breakdown voltage of the oxide layer).

The number of remaining oxidizing ions within the oxide layer may be reduced in various ways, while the semiconductor substrate is within an electrolyte.

For example, a repelling electrical field may be generated between the semiconductor substrate and an external electrode (e.g. same external electrode as used for anodic oxidation or another external electrode) within the electrolyte used for the anodic oxidation or an exchanged electrolyte. In this way, oxidizing ions located within the oxide layer are forced to move back into the electrolyte. Consequently, the number of remaining oxidizing ions within the oxide layer can be reduced due to the repelling electrical field.

A repelling electrical field may be generated by exchanging the voltages applied to the semiconductor substrate and the external electrode during the anodic oxidation. In other words, the repelling electrical field may be oriented inversely to the attracting electrical field. The repelling electrical field may comprise the same or a different strength compared to the attracting electrical field depending on the voltages applied to the semiconductor substrate and the external electrode.

Optionally, additionally or alternatively, the electrolyte used for carrying out the anodic oxidation may be exchanged for an electrolyte comprising less oxidizing ions than the electrolyte used for carrying out the anodic oxidation or comprise no (e.g. neglecting impurities) oxidizing ions. In this way, the supply with oxidizing ions is reduced or suppressed.

Optionally, an attracting electrical field (e.g. same or similar to the electric field applied during the anodic oxidation) can be generated between the semiconductor substrate and an external electrode (e.g. the same external electrode used for the anodic oxidation or another external electrode) within the exchanged electrolyte to accelerate further oxidation of the surface region by remaining oxidizing ions within the oxide layer. In other words, the remaining oxidizing ions within the oxide layer can be forced to diffuse to the semiconductor material of the semiconductor substrate and oxidize the semiconductor material so that the number of remaining oxidizing ions within the oxide layer may be significantly reduced, for example.

By using an anodic oxidation, a low temperature oxide with high quality (e.g. comparable to gate oxides) can be manufactured. For this, the process may be modified. During the anodic oxidation, OH⁻ ions may diffuse into the silicon by applying an electrical potential to the silicon (e.g. n-doped or p-doped silicon) out of the electrolyte and react to silicon dioxide (SiO₂):

The obtained oxide may comprise low quality due to a high concentration of OH-ions within the oxide representing active charge. These OH-ions may be removed from the oxide or may be completely or nearly completely oxidized at the silicon-silicon dioxide (Si—SiO₂) interface. For this, the polarity between the silicon (e.g. n-doped or p-doped silicon) and the electrolyte (e.g. external electrode) may be inverted and the OH⁻ ions may be removed. Alternatively or additionally, the electrolyte can be exchanged for a non-oxidizing electrolyte and the voltage may be applied until the OH⁻ is oxidized at the interface, for example.

Optionally, alternatively or additionally to one or more aspects mentioned above, the anodic oxidation may be used for growing a self-aligned oxide layer. For example, the semiconductor substrate may comprise at least one n-doped surface region and at least one p-doped surface region. An oxide growth at n-doped regions may be faster than at p-doped regions. In this way, a portion of the oxide layer extending along the n-doped surface region may comprise a greater thickness than a portion of the oxide layer extending along the p-doped surface region after the anodic oxidation, for example. In an example, the oxide layer at the p-doped region may be removed afterwards while leaving at least a part of the oxide layer at the n-doped surface region.

The anodic oxidation may provide a possibility for forming an oxide layer at very low temperatures. In this way, temperature-sensitive elements already manufactured on the semiconductor substrate may be protected from high temperatures. Optionally, additionally or alternatively to one or more aspects mentioned above, processes for forming the semiconductor substrate carried out after the anodic oxidation may comprise mainly (e.g. neglecting short temperature peaks) or only process temperatures below 650° C. (or below 450° C., below 250° C. or below 150° C.). In this way, an oxide layer may be manufacturable although one or more already formed elements of the semiconductor device cannot bear temperatures above 650° C. (or above 450° C., above 250° C. or above 150° C.), for example. For example, an oxide layer may be manufacturable at a backside of a semiconductor substrate although a temperature element sensitive to high temperatures (e.g. metal layer on top of the semiconductor substrate) may be already formed at the main surface of the semiconductor substrate.

Optionally, additionally or alternatively to one or more aspects mentioned above, the method for manufacturing a semiconductor device may comprise forming at least one field effect transistor structure (e.g. Metal-Oxide-Semiconductor-Field-Effect-Transistor MOSFET or an Insulated Gate Bipolar Transistor IGBT) on the semiconductor substrate. The field effect transistor structure may use a part of the anodic oxide layer as gate oxide, as insulation layer for insulating an electrical conductive layer connecting one part from another part or as trench isolation, for example.

Optionally, alternatively or additionally to one or more aspects mentioned above, at least one element of the semiconductor device (e.g. a field effect transistor structure, an Insulated Gate Bipolar Transistor structure or a diode structure) may comprise a blocking voltage or breakdown voltage of more than 10 Volts (or more than 100 Volts, more than 400 Volts, more than 600 Volts or more than 1200 Volts). In other words, the semiconductor device may comprise a blocking voltage or breakdown voltage of more than 10 Volts. For example, the semiconductor device may be a power semiconductor device.

Figure 2:
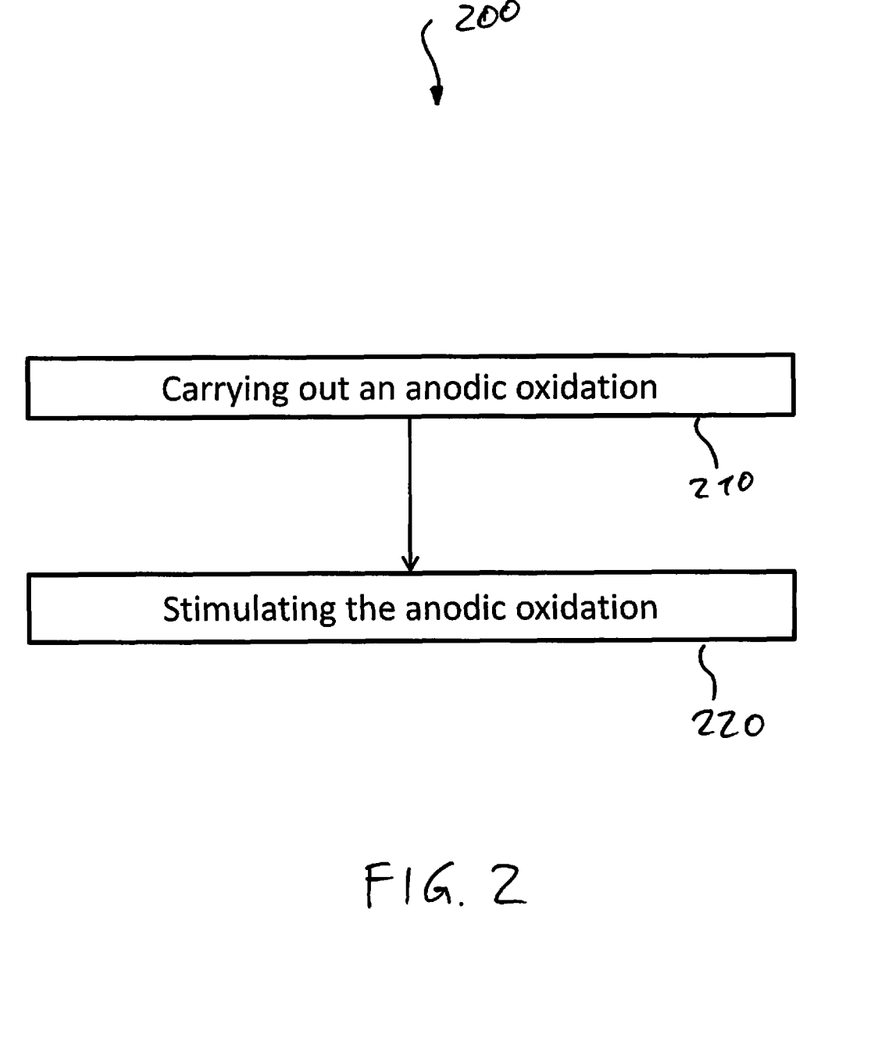
FIG. 2 shows a flow chart of another method for forming a semiconductor device.

FIG. 2 shows a flow chart of a method 200 for forming a semiconductor device according to an embodiment. The method 200 comprises carrying out an anodic oxidation 210 of a surface region of a semiconductor substrate to form an oxide layer at a surface of the semiconductor substrate by generating an attracting electrical field between the semiconductor substrate and an external electrode within an electrolyte to attract oxidizing ions of the electrolyte causing an oxidation of the surface region of the semiconductor substrate. Further, the method 200 comprises stimulating 220 the anodic oxidation independent from the attracting electrical field.

By stimulating the anodic oxidation additionally to the attracting electrical field, the growth of the oxide layer may be accelerated and/or a larger maximal thickness of the oxide layer may be obtainable.

The anodic oxidation may be carried out as described above (e.g. in connection with FIGS. 1 and 4).

The anodic oxidation may be stimulated at 220 in various ways. For example, at least a part of the surface region to be oxidized may be illuminated by light to stimulate the anodic oxidation. The illuminating light may accelerate the oxidation.

For example, at least a part of the surface region may be illuminated by light comprising at least partly a frequency or a frequency spectrum stimulating the oxidation of the semiconductor material of the semiconductor device by the oxidizing ions. Optionally, a frequency spectrum of the light illuminating the semiconductor substrate comprises a maximum less than 10% (or less than 1%) away from a frequency causing a maximal stimulation.

In one example, the whole surface of the semiconductor substrate may be illuminated. Alternatively, at least one local area of the surface of the semiconductor substrate may be illuminated, while other areas of the surface of the semiconductor substrate are not illuminated or significantly less illuminated (e.g. less than 10% of the illumination of the local area). For example, a light-absorbing material (e.g. absorbing more than 50%, more than 80% or more than 90% of the illuminated light) or a light-reflecting material (e.g. reflecting more than 50%, more than 80% or more than 90% of the incoming light) may be deposited at regions of the surface of the semiconductor substrate to be protected from the stimulation of the anodic oxidation.

For example, the illumination of local areas may be implemented by masking other areas and illuminating the semiconductor substrate with a normal light source or use a laser for targeted illumination of local areas. In other words, at least one local area of the surface of the semiconductor substrate may be illuminated by a laser while at least one other area of the surface of the semiconductor substrate is significantly less illuminated by the laser (e.g. less than 50%, less than 20% or less than 10% of the illumination of the local area) than the at least one local area of the surface of the semiconductor substrate.

By illuminating local areas, the growth of the oxide layer within these local areas can be accelerated in comparison to other areas. In this way, a thicker oxide layer may be obtained within the illuminated local areas, for example.

The anodic oxidation may be additionally accelerated by damaging the surface region of the semiconductor substrate (e.g. by implanting protons). For example, a masked damage implant of at least a part of the surface region of the semiconductor substrate may be done before the anodic oxidation.

Alternatively or additionally, the anodic oxidation may be stimulated by applying a magnetic field to the surface region of the semiconductor substrate or the whole semiconductor substrate. The oxide growth may be accelerated in regions with strong magnetic fields in comparison to regions with low magnetic fields, for example.

Optionally, additionally or alternatively to one or more aspects mentioned above, the temperature of the surface region may be increased to stimulate the anodic oxidation. By increasing the temperature, the chemical reaction of the oxidation may be accelerated.

In other words, the thickness of (e.g. self-adjusted) oxides by anodic oxidation may be grown with locally different thicknesses or a large oxide thickness may be achievable. Beside influencing of locally different oxide thicknesses by voltage drops, same may be catalyzed by injecting light and/or temperature. Further, the injection of magnetic fields may comprise a catalytic effect to the oxide growth.

A globally thick oxide may be obtained by a two-dimensional illumination with light, for example. The light may be globally irradiated, but local oxide thickness differences may be obtained by the kind of illuminated material (e.g. n-type or ptype), for example. In an example, the light may be irradiated targeted to areas (e.g. laser focusing), in which especially thick oxides should be grown.

Optionally, a photo technique with a light-absorbing or light reflecting auxiliary material (e.g. metal) may be done so that regions are uncovered, which should receive a thick oxide layer. Then light may be irradiated all over. Further optionally, a masked damage implant may be done first and afterwards and all over, or masked light irradiation may be done during the anodic oxidation, for example.

The method 200 may comprise one or more additional features corresponding to the concept or one or more embodiments described above (e.g. FIGS. 1 and 4). Further, the embodiments described above (e.g. in connection with FIG. 1) may comprise optionally additionally one or more aspects described in connection with FIG. 2 and the stimulation of the anodic oxidation.

Figure 3:
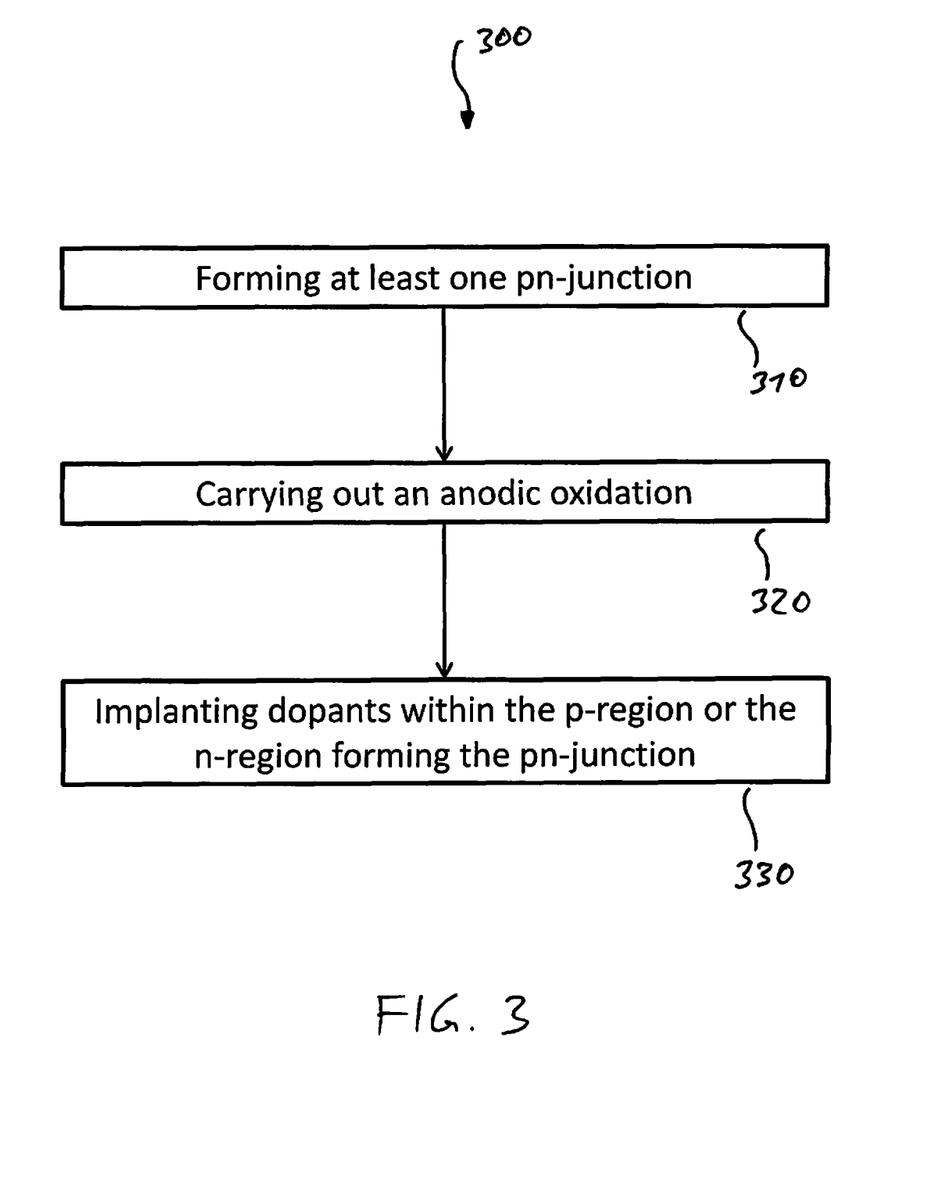
FIG. 3 shows a flow chart of another method for forming a semiconductor device.

FIG. 3 shows a flow chart of a method 300 according to an embodiment. The method 300 comprises forming 310 at least one pn-junction within a semiconductor substrate. Further, the method 300 comprises carrying out an anodic oxidation 320 of a surface region of the semiconductor substrate to form an oxide layer at the surface of the semiconductor substrate by generating an attracting electrical field between the semiconductor substrate and an external electrode within an electrolyte to attract oxidizing ions of the electrolyte causing an oxidation of the surface region of the semiconductor substrate, while a high voltage difference occurs at the pn-junction due to the attracting electrical field. Additionally, the method 300 comprises implanting 330 dopants within the p-doped region and/or the n-doped region of the pn-junction reducing a blocking voltage or breakdown voltage of the pn-junction below the high voltage difference occurring at the pn-junction during the anodic oxidation.

By generating a high attracting electrical field, the growth of the oxide layer may be accelerated or a larger maximal thickness of the oxide layer may be achievable. However, a high attracting electrical field may cause a high voltage difference at the pn-junction within the semiconductor substrate. By implementing a highly blocking pn-junction (high blocking voltage or breakdown voltage) damages due to the high voltage difference may be avoided. Afterwards, the properties of the pn-junction can be adapted to the requirements of the semiconductor device to be formed by an additional implant reducing the blocking voltage or breakdown voltage of the pn-junction, for example.

The pn-junction may be formed 310 in various ways (e.g. depending on the kind of semiconductor device to be formed). For example, the semiconductor substrate may comprise a base-doping of a first conductivity type (e.g. n-doped or p-doped) and at least one doping region of the second conductivity type (e.g. n-doped or p-doped) may be implanted reaching from the surface of the semiconductor substrate (e.g. main surface) into the semiconductor substrate. At the border between the doping region of the second conductivity type and the remaining semiconductor substrate with the base doping, a pn-junction is formed. The implanted doping region may be a local area of the semiconductor substrate or may extend along the whole surface of the semiconductor substrate, for example.

The anodic oxidation may be carried out 320 according to the described concepts or one or more embodiments described above (e.g. in connection with FIGS. 1, 2 and/or 4).

The attracting electrical field may cause a high voltage difference at the pn-junction. The voltage difference may be high in comparison to the blocking voltage of the pn-junction after the following implant of dopants within the p-doped region and/or the n-doped region of the pn-junction, for example.

The blocking voltage and/or breakdown voltage of the pn-junction may be reduced by increasing the dopant concentration within the p-doped region and/or increasing the dopant concentration within the n-doped region of the pn-junction, for example.

The method 300 may comprise one or more additional features corresponding to the described concept or one or more embodiments described above (e.g. in connection with FIG. 1, FIG. 2 or FIG. 4). Further, one or more aspects mentioned in connection with the method 300 may also be used by one or more embodiments described above (e.g. in connection with FIG. 1 or 2).

Some embodiments relate to a semiconductor device formed according to the described concept or one or more embodiments described above.

Some embodiments relate to a low temperature backside oxide. The manufacturing of oxides with high quality at simultaneously low temperatures may be possible also below 400° C. by using the described concept, for example. In comparison, oxides formed by plasma-induced chemical gaseous phase deposition (e.g. Plasma-Enhanced Chemical Vapor Deposition CVT, PECVT) may reach the range of 200° C., but without a following annealing act at higher temperature no good oxide quality may be obtained.

After the complete processing of a wafer at the frontside, the wafer may be attached to a carrier system for vertical devices and may be thinned at the backside. If further process acts may be desired at this time at the backside, the available temperatures are limited due to the frontside metallization and/or by the valuable carrier systems (e.g. glass carrier and glue). For the processing of the wafer backside, individual processes as oxide deposition and/or metal deposition as well as structuring may be desired.

According to the proposed concept or one or more embodiments described above, voltage depending thick oxides at the wafer backside (backside oxides) may be formed, which may be used in various technologies. For example, at 400 Volts/600 Volts/1200 Volts IGBTs, the method may be used to implement oxide in the region of the etch termination between silicon and backside metal in order to reduce the charge carrier flooding (carrier confinement) in the etch region. For example, the backside of an IGBT wafer, which comprises a structured p-emitter, may be oxidized so that a sufficiently thick oxide layer is obtained on the very low p-doped or also n-doped regions in the edge region, which may be positive for the reverse blocking capability and/or the dynamic switch-off robustness of the IGBT chips, for example.

Further, a source down technology may also use an oxide in the region of, for example, 0.5-1 µm thickness at the wafer backside in order to enable an insulation between drain and gate. This oxide thickness may be scaled with the requirements for the blocking voltage, for example.

The anodic oxide may be masked by a structured photoresist or in connection with a nitride layer in order to form a low temperature local oxidation of silicon LOCOS (e.g. LOCOS like backside oxide), for example. Additionally the anodic oxidation may be coupled with a simultaneous electrochemical etching of neighboring (p-doped) regions.

With such an oxide mask, a stepped implementation mask may be generated for implementing a stepped field stop for improving the diode and/or IGBT softness, for example. Further this may be used for devices with highly doped emitter regions neighboring lowly doped emitter regions (at the backside). In this case, also n-regions neighboring p-emitter regions may be implementable, since the n-regions may be covered by an insulating oxide during the anodic oxidation and may not influence the blocking capability in this way, for example.

Another application may be a fast diode, which may comprise lightly n-doped regions neighboring highly n-doped regions at the wafer backside. In this way, a critical punch-through of the depletion zone to the backside metallization may be avoided and/or a disturbing contamination of the lightly doped backside regions by boron atoms may be avoided, for example.

The described concept may be used to generate cold oxides on arbitrary layers. For this, an n-doped polysilicon may be deposited on a surface and may be converted to silicon dioxide by the anodic oxidation afterwards. In comparison to a PECVD (Plasma-Enhanced Chemical Vapor Deposition) oxide deposition, the oxide quality may be higher and/or topology steps may be better filled. Further, an application may be a high temperature carrier system based on cold wafer bonding at the frontside, for example. The topology steps may be used as capillary tube for the fol lowing oxide etching for the wafer separation.

Optionally, the thickness of the cold oxide or anodic oxide may be increased in various ways. For example, a thickening of the cold formed oxide (oxide formed by anodic oxidation) may be done by generating trenches, which are dimensioned so that the trench as well as the measure (semiconductor material between trenches) is oxidized (trench may be closed due to the oxidation). A targeted tilt of the oxides may be formed by different widths of the trenches, for example. The depth of the trenches may define or influence the thickness of the resulting cold oxides.

Alternatively or additionally, an amorphous silicon or polycrystalline silicon may be deposited by HFCVD (Hot Filament Chemical Vapor Deposition at 150° C.-750° C.) and oxidized (by anodic oxidation) afterwards. This method may be repeated arbitrarily to generate a desired end thickness, for example.

The anodic oxidation may be used for growing silicon dioxide at nearly room temperature, for example. In this way, thermo mechanical stress may be reduced or avoided so that no significant wafer bow at room temperature may occur. Therefore, the manufacturing of sensor applications and/or MEMS applications (Micro Electromechanical System) with largely extending silicon cantilever or beam or large silicon membrane may be improved.

Further, gate oxides may be implemented at the backside. For example, an integration of MOS devices at the wafer backside may be possible. An application may be a bi-directionally blocking and/or bi-directionally conducting MOS transistor.

Furthermore, a trench filling at load time bridges may be enabled. For example, trenches at etches may be filled by a low temperature filling of BCB (Benzocyclobutene) or another polymer at the end of the process, for example. In this way, a charge and trapärmere interface semiconductor/insulator may be formed with an anodic oxidation.

Trenches may be etched at the backside for source down transistors, which may be covered by anodic oxidation, for example. The bottom of the trench may be opened and filled with highly doped polys (silicon) or metal in order to obtain a conducting. Alternatively, a silicon mesa region may be used for conducting, for example.

Examples may provide a structure and process flow for forming a silicon dioxide SiO2 layer with low concentration of not reacted starting material and therefore with good electric quality (e.g. at the process end, with temperatures and following temperatures below 650° C., 450° C. or 250° C.).

The interface oxide/semiconductor can be adjusted and defined very well with the anodic oxidation. An oxide with high blocking capability may be implemented also at semiconductor surfaces with peaks or a rough surface. Peaks at the semiconductor may get rounded, since the oxide may grow faster at the peaks of the semiconductor due to the concentration of the electric field lines, since the diffusion of the reaction partners (OH—) may be accelerated by the electric field. In this way, an electric field may be reduced during operation (of the semiconductor device) and may increase the operation safety of a device manufactured in this way. An oxide stack of an anodic grown oxide and a further oxide layer deposited at low temperatures may comprise a higher breakdown persistency than an oxide layer of deposited oxide of same sum thickness.

Some embodiments relate to a power semiconductor with self-adjustedly deposited insulation layer. Several applications may use self-adjusted or self-aligned oxidation of an n-doped silicon, for example. For example, p- and n-doped regions may be located adjacent to each other and mainly or only an oxidation of the n-doped regions may be done. Further, a thickness of the oxide may be increased.

In comparison to the selective deposition of oxide layers on n-doped regions based on an all over oxide deposition and following photo technique and etching acts is complex and is subject to inaccuracies in comparison to the self-aligned method.

The self-aligned method may also be used for power applications, for example. The method may be based on an anodic oxidation as described in FIG. 4, for example.

If the electric field is varied at the surface of the semiconductor to be oxidized (e.g. by definition of the corresponding lateral doping profile at the semiconductor surface), the OH-diffusion and consequently also the reachable oxide thickness may be variable.

The anodic oxidation may be used to deposit a self-adjusted or self-aligned oxide layer on an n-doped region at specific device structures, for example.

A thicker oxide in the region of an n-doped drift zone than in the region of p-doped areas may be desired for IGBTs with trench gate. The neighboring p-regions may the p-body and/or the floating p-region. The thicker oxide may reduce current oscillations during the switch-off process of the IGBT, for example. The method may also be applied to super junction devices with a trench gate, for example.

For example, a thick oxide may be formed in the region of the n-doped drift zone and afterwards an additional oxide may be thermally grown within the whole trench region and the wafer surface, which may also be used as gate oxide next to the p-body region, for example. Further, an additional thermal oxide act may be used for improving the quality of the anodic generated thick oxide, for example.

Additionally, weak spots of the oxide occurring at the transition from the trench bottom to the trench wall may be avoided by the thick oxide in this region, for example.

Further, a deposited oxide layer self-adjusted on an n-doped area may be used within HDR-regions (High Dynamic Robustness) of IGBTs. These are regions, in which the backside p-emitter is left out in the etch region and optionally also in the region of gate pads and gate wiring or lines in order to avoid current superelevation, which may occur during the switch-off process within these regions. The increased local hole current density being in connection with this may lead to a local dynamic avalanche in these regions and consequently to a worsening of the safe operation area (SOA) of these devices. The self-adjusted covering of these n-doped regions with oxide layers may enable a certain reverse blocking capability of these devices, since the blocking pn-junction between the backside emitter and the drift zone or the field stop zone would be short cut without this insulation layer. Further, the risk of a dynamic punch-through of the depletion zone to the backside metallization (e.g. at cosmic radiation events) may be reduced or avoided. Furthermore, the described method may be used for thin wafer devices (e.g. 1700 Volt IGBTs, 1200 Volt IGBTs, 600 Volt IGBTs or 400 Volt IGBTs), since thermal deposition of backside oxides is not usable, especially at wafer diameters larger than or equal to 6", for example. After the anodic oxidation, an overetch may be done, which may etch the thin oxide at the p-region completely, while a part of the thick oxide on the n-region remains, since a thin oxide may grow also on the p-region during the anodic oxidation, for example.

The described method may enable a self-adjusted growth of oxides similar to a LOGOS-method. With the proposed method, a self-adjusted oxide step may also be obtainable in vertical direction by a variation of the doping (e.g. by a step within the semiconductor region).

Further, oxides with very flat gradients may be formed by a variation of the height or magnitude of the p-doping and a corresponding lateral variation of the electric field strength at the semiconductor surface, for example. Such a flat gradient of an oxide may be significantly flatter than obtainable by another method with oxide grown all over, damaging of the surface by damage implantation and isotropic etching, for example. Further, the root point or base point of the oxidation may be variable defined in its position in contrast to an etch edge.

According to an aspect, a self-aligned or self-adjusted insulation layer on n-doped regions may be implemented, which are arranged between p-doped regions. Such structures may be used for IGBTs with trench gate and/or IGBTs, which comprise HDR-structures, for example. Further, such self-aligned deposited layers may be formed in trenches of power MOSFETs (Metal Oxide Semiconductor Field Effect Transistor).

Some methods relate to the manufacturing of such anodically oxidized regions. Such methods may enable the manufacturing of (local) very thick anodic oxides, for example.

A further method for increasing the oxide thickness of an anodic oxidation may be providing an initially highly blocking configuration of pn-junctions to which high voltages may be applied for the anodic oxidation process, for example. After an anodic oxidation of a desired thickness is done, the existing pn-junction configuration may be adapted to a low voltage device class by preceding implantation, for example.

For the implementation of large field oxide FOX oxide thicknesses at medium voltage to high voltage MOSFETs, the pn-junction (local or global) may be implemented highly blocking in order to enable an anodic oxidation to obtain large oxide thicknesses. Afterwards, the mesa region between the oxide may be adapted for a corresponding low voltage class by an epitaxial (Epi) enhancement implantation, for example.

Alternatively, a higher oxidation rate for thicker oxides may be obtained by an n-implant at the trench bottom or by a damage implantation, for example. An n-implantation may be compensated after the oxidation by a p-implant.

A vertically perforated oxide may be formed (e.g. to be used as a diffusion barrier for diffusion material or elements or electron hole plasma) based on n- and players stacked above each other as a starting material by trench etching and anodic oxidation and back-etching of the oxide at the p-regions and epitaxial filling of the trenches, for example. The layered pn-stack may be dispersed or cleared by an inter-diffusion, for example.

Embodiments may further provide a computer program having a program code for performing one of the above methods, when the computer program is executed on a computer or processor. A person of skill in the art would readily recognize that acts of various above-described methods may be performed by programmed computers. Herein, some embodiments are also intended to cover program storage devices, e.g., digital data storage media, which are machine or computer readable and encode machine-executable or computer-executable programs of instructions, wherein the instructions perform some or all of the acts of the above-described methods. The non-transitory program storage devices may be, e.g., digital memories, magnetic storage media such as magnetic disks and magnetic tapes, hard drives, or optically readable digital data storage media. The embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A method for forming a semiconductor device, the method comprising:
    carrying out an anodic oxidation of a surface region of a semiconductor substrate to form an oxide layer at a surface of the semiconductor substrate by generating an attracting electrical field between the semiconductor substrate and an external electrode within an electrolyte to attract oxidizing ions of the electrolyte, causing an oxidation of the surface region of the semiconductor substrate;
    reducing a number of remaining oxidizing ions within the oxide layer, while the semiconductor substrate is within an electrolyte; and
    exchanging the electrolyte used for carrying out the anodic oxidation for an electrolyte comprising less or no oxidizing ions to reduce the number of remaining oxidizing ions within the oxidized surface region.

2. The method according to claim 1, further comprising generating an attracting electrical field between the semiconductor substrate and an external electrode within the exchanged electrolyte to accelerate further oxidation of the surface region by remaining oxidizing ions within the oxide layer.

3. The method according to claim 1, wherein reducing the number of remaining oxidizing ions within the oxide layer comprises generating a repelling electrical field between the semiconductor substrate and an external electrode within the electrolyte.

4. The method according to claim 1, wherein the repelling electrical field is oriented inversely with respect to the attracting electrical field.

5. The method according to claim 1, further comprising illuminating at least a part of the surface of the semiconductor substrate to stimulate the anodic oxidation, or comprising applying a magnetic field to the surface of the semiconductor substrate to stimulate the anodic oxidation.

* * * * *